United States Patent [19]

Farnow

[11] 4,173,064

[45] Nov. 6, 1979

[54] SPLIT GATE ELECTRODE, SELF-ALIGNED ANTIBLOOMING STRUCTURE AND METHOD OF MAKING SAME

[75] Inventor: Stephen A. Farnow, Dallas, Tex.

[73] Assignee: Texas Instruments Incorporated, Dallas, Tex.

[21] Appl. No.: 826,279

[22] Filed: Aug. 22, 1977

[51] Int. Cl.$^2$ ............................................. B01J 17/00
[52] U.S. Cl. ........................................ 29/578; 29/571; 357/24; 357/91
[58] Field of Search .................... 29/571, 578; 357/24, 357/91

[56] References Cited

U.S. PATENT DOCUMENTS

| 3,967,365 | 7/1976 | Friedrich | 357/91 |
| 4,035,906 | 7/1977 | Tasch | 357/91 |

Primary Examiner—W. Tupman
Attorney, Agent, or Firm—Melvin Sharp; Richard L. Donaldson; William E. Hiller

[57] ABSTRACT

Excess signal charge generated in response to optical overload of a charge-coupled sensing region is removed from that region by an antiblooming drain implanted in the substrate of the sensing array. The antiblooming drain is separated from the row of sensing regions by a potential barrier produced by a gate electrode associated with the drain. In fabricating the charge-coupled optical imager, the antiblooming drain is self-aligned with the antiblooming gate electrodes by first providing a pair of spaced-apart antiblooming gate electrodes and implanting the drain region into the substrate using the gate electrodes as a mask.

2 Claims, 5 Drawing Figures

SPLIT GATE ELECTRODE, SELF-ALIGNED ANTIBLOOMING STRUCTURE AND METHOD OF MAKING SAME

BACKGROUND OF THE INVENTION

The present invention pertains to optical imagers and, more particularly to an improved charge-coupled optical imager having a self-aligned blooming control structure and a method of fabricating the blooming control structure.

A charge-coupled imaging device (hereinafter referred to as a CCD imager) may be thought of as a two-dimensional array of "Light Sensing Element". Each light sensing element corresponds to a potential well created within a semiconductor substrate along with its overlying insulation and electrodes. The array usually consists of rows of these light sensing elements, called channels, separated laterally from each other by heavily-doped barriers, called channel steps. When a scene is optically imaged onto this array, photogenerated charge is stored in each element in an amount proportional to the local light intensity of the scene. The optical information is thus converted into an electrical signal. The CCD electrode structure may then be used to sequentially clock the stored packets of charge to an output amplifier region which then senses the amount of charge in each packet.

CCD imaging technology is well known in the semiconductor art and structures suitable for operation with one, two, three, and four phase clock pulse sources have been described in the literature. Also well known is the existence of both frontside and backside illuminated imagers. The present invention concerns itself with a problem that is common to all CCD imager structures and thus pertains to each of them.

The problem results when the imaging array is illuminated by a scene in which certain regions are much brighter than others. In this case, the portions of the array receiving the intense radiation (which may be $10^5$ times the average scene intensity) will become overloaded. Specifically, the intense radiation impinging on a particular location in the array results in the generation of more signal charge than can be stored at that location. The excess charge tends to spread to the adjacent element or elements along the channel as well as into adjacent channels. This spreading of charge will manifest itself as "blooming" of the image which is read out of the array. Accordingly, "blooming" is defined as the spreading of the charge originally accumulated in a light sensing element in such a way as to interact with charge accumulated in adjacent light sensing elements. The region of intense radiation in the scene may therefore appear, when read out and subsequently reproduced, to occupy a much larger area than that occupied by the original.

The basic idea behind blooming control consists of providing an overflow drain for excess photogenerated carriers. This drain can consist of a reverse biased region doped to the polarity opposite from the semiconductor substrate. These overflow drains can then be placed between the transfer channels replacing the channel stop barriers and interconnected and accessed at the end of the device opposite from the serial register readout. A potential barrier can then be created, between each channel and drain, such that only excess charge in the channel, will spill into the overflow drain. One method of creating this potential barrier is disclosed in the *Bell System Technical Journal*, "Blooming Suppression in Charge-Coupled Area Imaging Devices," C. H. Sequin, 51, 1923–1926. The overflow threshold (or barrier) potential is established by a special threshold electrode. This electrode, which runs the full length and overlaps to each side of the overflow drain will set the potential barrier between the drain and channel when an external bias is placed on it. When set exactly at the threshold potential, the electrode will allow all excess carriers to spill into the overflow drain.

Inasmuch as blooming will begin to appear when the electrode bias is above threshold, this bias is usually held below threshold to provide a margin for error. It should be appreciated, however, that the well capacity (the total amount of charge that may be stored in one element) will be affected by the barrier height. As the barrier is lowered below threshold, carriers (in addition to excess) that were otherwise "storable," will spill into the overflow drain. The well capacity is thus effectively lowered.

An essential requirement of this type of blooming control is that the special threshold electrode be precisely aligned over the antiblooming drain. The width by which the electrode overhangs each side of the drain will affect the barrier height (partly as a result of the small geometries and partly as a result of the reverse bias on the drain). The tolerance required for this alignment is extremely small and is not compatible with present IC manufacturing alignment capabilities. As may be understood from the above discussion, any misalignment, however small, will result in degradation of the blooming control and/or non-uniform blooming control and well capacity.

Accordingly, an object of the present invention is to provide improved charge coupled imagers.

A further object of the present invention is to provide a charge-coupled imager having a split threshold electrode which is self-aligned to the overflow drain.

Another object of the present invention is to provide a method for fabricating a split electrode antiblooming structure for a charge-coupled imager.

SUMMARY OF THE INVENTION

In accordance with the present invention, a pair of spaced apart antiblooming electrodes are formed over an insulating layer provided on a semiconductor substrate. The surface of the CCD optical imager is masked and patterned to provide an unobstructed opening between the pair of antiblooming electrodes which themselves act as a mask. A subsequent arsenic implant provides the antiblooming drain region in the substrate as bounded by the antiblooming electrodes thereby providing a self-aligned antiblooming structure.

BRIEF DESCRIPTION OF THE DRAWINGS

The invention, together with its various features and advantages, can be easily understood from the following, more detailed description taken in conjunction with the accompanying drawings in which.

DETAILED DESCRIPTION

In each of the embodiments of the invention to be described, the CCD imager includes a channel region defined in a semiconductor substrate. The channel is peripherally bounded by channel stop regions and includes appropriate structure for inputting signals, in the form of charged packets into the channel beneath one or more selected phase electrodes. These charged packets are propagated along the channel by suitable clock pulses applied to phase electrodes located above the channel and insulated from the semiconductor surface, the charge packets being extracted as output signals by suitable output structure. As thus far described, the CCD imager structure and method of fabricating it are known in the art, see for example U.S. Pat. No. 4,024,563 and U.S. Pat. No. 4,027,382. Since they do not form part of the present invention, they will be further described only in so far as they relate to the formation of the split gate electrode, self-aligned antiblooming structure.

It will be assumed that the semiconductor material is silicon, and that an N-channel (P-substrate) CCD imager is being fabricated. However, it is to be appreciated that the concept of the invention is applicable also to the fabrication of P-channel (N-substrate) CCD imager structures as well as to CCD imager structures utilizing other semiconductor materials, for example, germanium and gallium arsenide.

Figure 1:
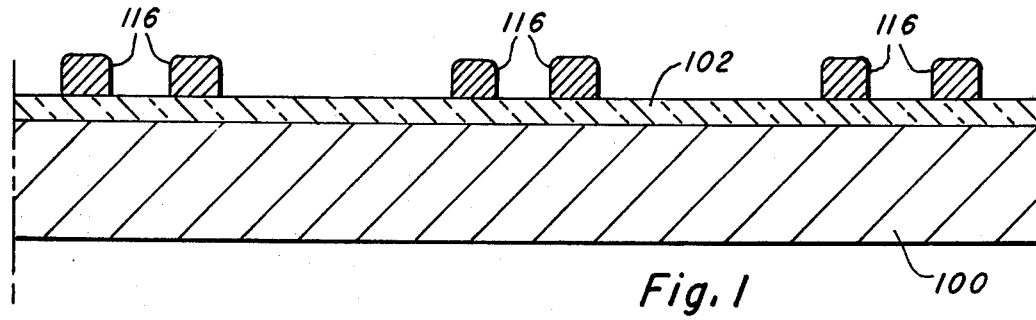
FIGS. 1–5 are cross-sectional views illustrating various steps in the process for fabricating a CCD optical imager having a split gate electrode, self-aligned antiblooming structure.

Referring now to FIG. 1, there is indicated a P-type silicon substrate 100 on the upper surface of which is located a thin insulating layer 102. This silicon dioxide layer is grown to a thickness of about 1000A°. In one embodiment, a layer of phosphorous doped polycrystalline material is deposited over the silicon dioxide layer 102. The selection of material for the antiblooming electrodes does not constitute a part of this invention and as such may comprise any suitable material such as aluminum, or N and P type doped polycrystalline material. The polycrystalline layer is next patterned, using conventional photolithographic and etching techniques, to expose those regions to be etched in the fabrication of the antiblooming gate electrodes. In etching away the exposed polycrystalline layer, antiblooming gate electrodes 116 are formed on the surface of the silicon dioxide layer. The antiblooming electrodes 116 in one embodiment are fabricated so as to be spaced apart a distance of approximately 0.2 mils, each of the antiblooming electrodes 116 being approximately 0.1–0.2 mils across. It is apparent to one skilled in the art that this antiblooming structure may be fabricated according to other dimensions without departing from the spirit and scope of the present invention. These antiblooming gate electrodes 116 provide the mask for the subsequent implant of the antiblooming drain. The operation of the antiblooming device is described in more detail in IEEE Transactions On Electron Devices, Volumn ED-21, No. 6, June 1974, Pages 331–341.

In order to permit the transfer of charge along the vertical channels and also to limit the amount of integrated charge, a potential barrier must be established between the channel and the overflow drain. Carriers are collected in the potential wells underneath the gate electrodes. After the potential wells are filled to the barrier potential, excess carriers will flow laterally into the overflow drain. For proper operation, the electrodes that isolate the resolution elements in the vertical direction have to produce a barrier potential which is lower than the barriers between adjacent elements, so that excess carriers will flow into the overflow drain before they spill along the transfer channel.

Figure 2:
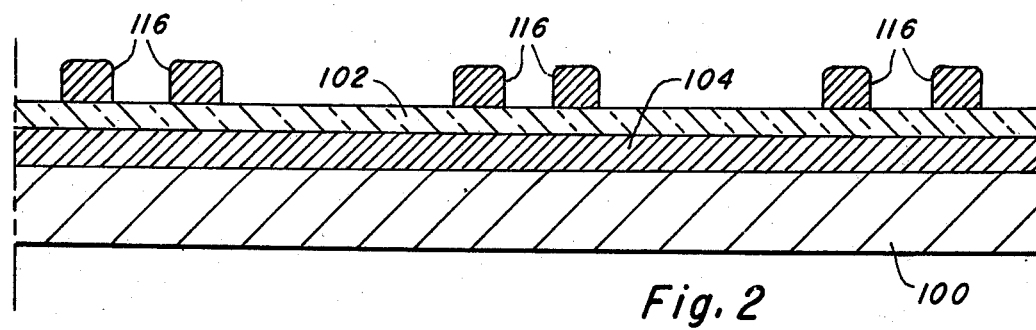

The embodiment of the present invention may in addition to the transfer channel indicated in FIG. 1 comprise a buried channel as indicated in FIG. 2. Buried channel structures have become well known in the semiconductor art and were described by R. H. Walden et al in "The Bury Channel Charged-Coupled Device," Bell System Technical Journal, September 1972. Buried channel CCD's have been shown to have high transfer efficiency and to be capable of operation at relatively high frequencies. In fabricating the buried channel CCD as indicated in FIG. 2, the surface of the substrate 100 is implanted with a phosphorous implant 104 to a depth of about 0.5 microns producing an N-region on the surface of the substrate 100. The phosphorous implant of the buried channel CCD is performed prior to growth of silicon dioxide layer 102 and prior to depositing the polycrystalline layer used in fabricating the antiblooming gate electrodes 116 as indicated in FIG. 1.

Figure 3:
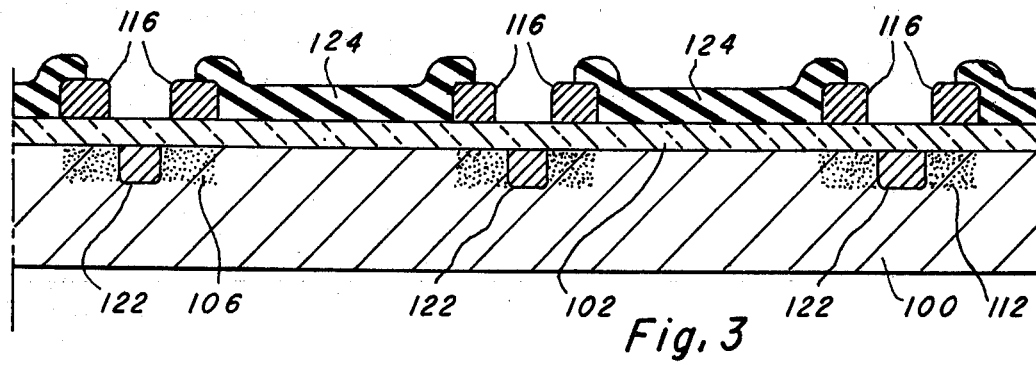

Referring now to FIG. 3, the method of implanting the antiblooming drain is indicated. A layer of photoresist 124 is deposited on top of the silicon dioxide layer 102. Next, using conventional photolithographic and etching techniques an opening is produced so as to expose the region between the two antiblooming gate electrodes 116. The photoresist layer 124 and the antiblooming gate electrodes 116 provide the mask for the process of implanting the antiblooming drain. After the openings in the photoresist mask 124 are produced, the antiblooming drains 122 are implanted into the semiconductor substrate 100 by means of an arsenic implant which is well known in the prior art. As noted, the function of the antiblooming drain is to drain up excess charge that might otherwise spill into neighboring potential wells and, to prevent the complete collapse of the depletion region at the silicon surface and thus ensure that the carriers in the bulk are always collected with a minimum of lateral diffusion. The overflow barrier as previously described is created under the antiblooming electrodes 116 in the body of the semiconductor substrate 100 as indicated by the dotted area 106 in FIG. 3. This allows one to adjust the height of the overflow barrier by separate potentials, or even to reduce the integration time by suitably pulsing those electrodes.

Figure 4:
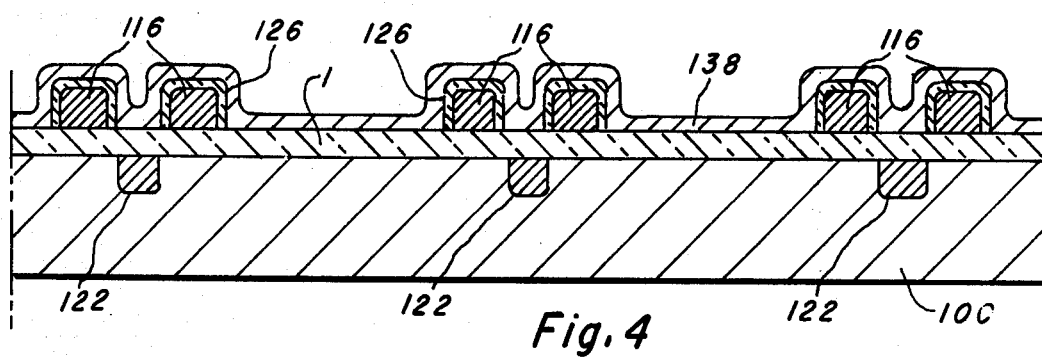
Figure 5:
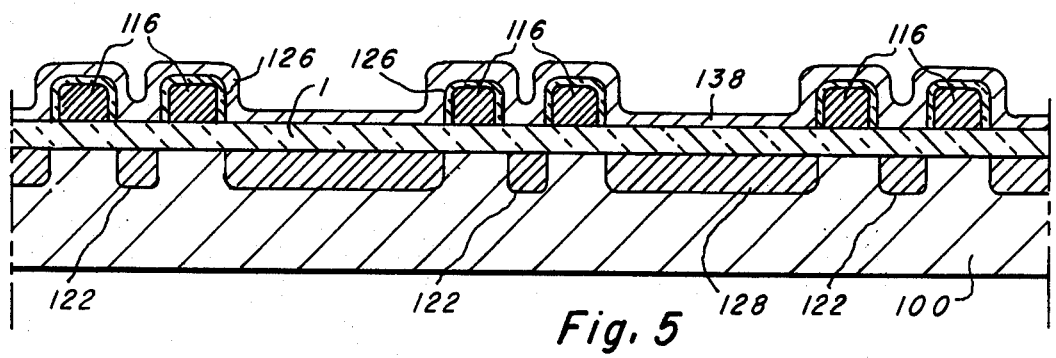

Referring now to FIGS. 4–5 cross-sections of completed CCD optical imagers are indicated. In FIG. 4 the silicon dioxide layer is removed and re-oxidization of the gate area is performed for the purpose of forming a new high quality silicon dioxide layer 126. The silicon dioxide layer not only covers the channel region but in addition provides an insulating layer encapsulating the antiblooming drain electrodes 116. At this point of the CCD imager fabrication process, phase electrodes may be provided.

However, an alternative CCD imager structure may be provided as indicated in FIG. 5. Prior to the re-oxidization of layer 126, a buried channel region 128 may be implanted as indicated. As noted in the embodiment of FIG. 2 a buried channel CCD imager having a buried channel under the antiblooming gate electrode is disclosed. In this embodiment, the buried channel may be fabricated so as not to be underneath the antiblooming gate electrode 116. The buried channel of FIG. 5 is fabricated by a phosphorous implant after the fabrication of the antiblooming electrodes 116 as indicated in FIG. 4. This forms a lightly doped N-type region 128 under new oxide layer 126, but not under the antiblooming gate electrodes 116 which act as a mask. In completing the CCD imager structure as in FIG. 4, re-oxidization of the gate area thereby forming new silicon dioxide layer 126 is performed. The silicon dioxide layer is regrown to a thickness of approximately 1000–2000A°.

In completing the fabrication of the CCD imager, phase electrodes are provided. In fabricating the CCD imager a number of phase electrodes may be provided such as a two phase CCD, a three phase CCD, or a four phase CCD. The phase electrodes may be fabricated according to the method disclosed in U.S. Pat. No. 4,027,382 or by other known methods and as such do not constitute a part of the present invention.

While particular embodiments of this invention have been disclosed herein, it will be understood that various modifications may become apparent to those skilled in the art without departing from the spirit and scope of the invention which is defined by the appended claims.

What is claimed is:

1. A method of fabricating an antiblooming drain structure in a charge-coupled device imager comprising:

forming a pair of spaced apart electrodes on an insulating layer disposed on a semiconductor substrate of a first type conductivity;

providing a layer of photoresist material covering said electrodes and the insulating layer on said substrate;

patterning said photoresist layer to provide an aperture therethrough in alignment with the space between said pair of electrodes and exposing the portion of said insulating layer extending between said electrodes, wherein said electrodes serve as a first mask defining the exposed portion of said insulating layer extending therebetween and said patterned photoresist layer serves as a second mask covering the portion of the insulating layer on opposite sides of said electrodes; and forming a drain region of a second type conductivity opposite to that of said substrate by directing a dopant impurity of the second type conductivity through the aperture in said patterned photoresist layer and penetrating through the exposed portion of said insulating layer extending between said electrodes into said substrate such that the drain region is self-aligned with respect to said electrodes.

2. A method as set forth in claim 1, wherein said drain region is formed by implanting dopant ions of the second type conductivity into said substrate through the exposed portion of said insulating layer extending between said electrodes.

* * * * *